United States Patent
Park et al.

(10) Patent No.: US 10,910,468 B2
(45) Date of Patent: Feb. 2, 2021

(54) CAPACITOR STRUCTURE

(71) Applicant: Winbond Electronics Corp., Taichung (TW)

(72) Inventors: Cheol Soo Park, Taichung (TW); Ming-Tang Chen, Taichung (TW); Chun-Chieh Wang, Taichung (TW)

(73) Assignee: Winbond Electronics Corp., Taichung (TW)

( * ) Notice: Subject to any disclaimer, the term of this patent is extended or adjusted under 35 U.S.C. 154(b) by 0 days.

(21) Appl. No.: 16/739,120

(22) Filed: Jan. 10, 2020

(65) Prior Publication Data
US 2020/0152732 A1 May 14, 2020

Related U.S. Application Data

(62) Division of application No. 15/986,827, filed on May 23, 2018, now Pat. No. 10,566,415.

(30) Foreign Application Priority Data

Jun. 9, 2017 (CN) .......................... 2017 1 0430909

(51) Int. Cl.
*H01L 49/02* (2006.01)
*H01L 27/108* (2006.01)
(52) U.S. Cl.
CPC .............. *H01L 28/87* (2013.01); *H01L 28/91* (2013.01); *H01L 27/10805* (2013.01); *H01L 27/10852* (2013.01)

(58) Field of Classification Search
CPC combination set(s) only.
See application file for complete search history.

(56) References Cited

U.S. PATENT DOCUMENTS

| | | | | |
|---|---|---|---|---|
| 9,018,733 B1* | 4/2015 | Lee | .................... | H01L 27/1085 |
| | | | | 257/532 |
| 2008/0186648 A1* | 8/2008 | Choi | ..................... | H01G 4/005 |
| | | | | 361/305 |
| 2009/0257169 A1* | 10/2009 | Chen | ..................... | H01L 28/90 |
| | | | | 361/301.4 |
| 2014/0361403 A1* | 12/2014 | Cho | ..................... | H01L 21/764 |
| | | | | 257/532 |
| 2015/0179820 A1* | 6/2015 | Kim | ..................... | H01L 29/518 |
| | | | | 257/324 |
| 2016/0293599 A1* | 10/2016 | You | ..................... | H01L 27/0886 |

* cited by examiner

*Primary Examiner* — Ratisha Mehta
(74) *Attorney, Agent, or Firm* — JCIPRNET

(57) ABSTRACT

Provided is a capacitor structure including a substrate, a cup-shaped lower electrode, a top supporting layer, a capacitor dielectric layer, and an upper electrode. The cup-shaped lower electrode is located on the substrate. The top supporting layer surrounds the upper portion of the cup-shaped lower electrode. The top supporting layer includes a high-k material. Surfaces of the cup-shaped lower electrode and the top supporting layer are covered by the capacitor dielectric layer. A surface of the capacitor dielectric layer is covered by the upper electrode.

6 Claims, 15 Drawing Sheets

B-B

A-A

B-B

A-A

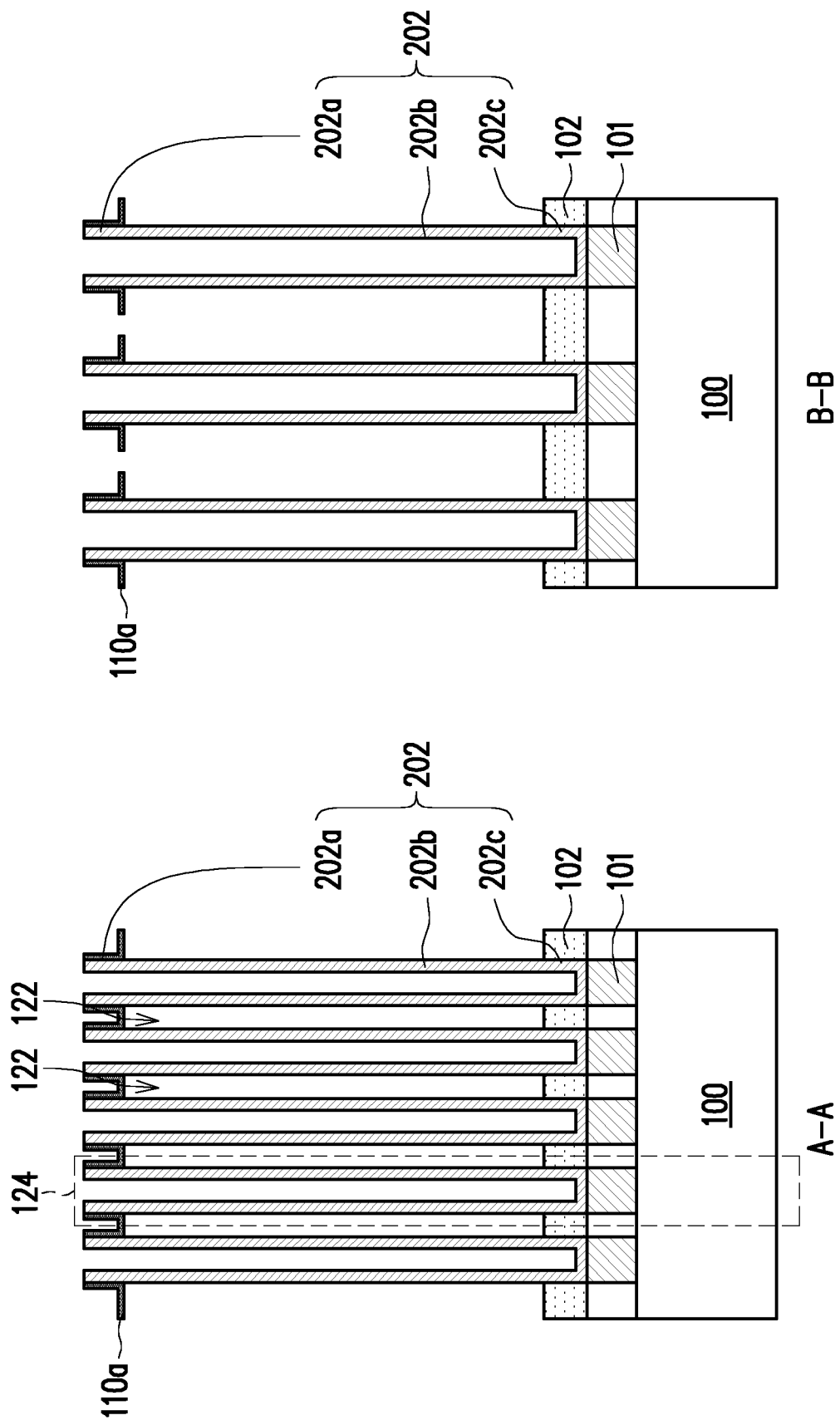

CAPACITOR STRUCTURE

CROSS-REFERENCE TO RELATED APPLICATION

This application is a divisional application of and claims the priority benefit of U.S. application Ser. No. 15/986,827, filed on May 23, 2018, now allowed, which claims the priority benefit of China application serial no. 201710430909.4, filed on Jun. 9, 2017. The entirety of each of the above-mentioned patent applications is hereby incorporated by reference herein and made a part of this specification

BACKGROUND OF THE INVENTION

Field of the Invention

The invention relates to a semiconductor structure, and more particularly, to a capacitor structure.

Description of Related Art

A dynamic random access memory is a volatile memory and is formed by a plurality of memory cells. Specifically, each memory cell is mainly formed by one transistor and one capacitor controlled by the transistor. The capacitor is mainly used to store charge representing data, and needs to have high capacitance to ensure data is not readily lost.

With the progress of technology, every electronic product is being developed to have high speed, high efficiency, and light weight and small size. However, along with the trend, the need for a dynamic random access memory having higher capacitance is also increased. Therefore, the design of the dynamic random access memory is also being developed to have high integrity and high density. However, the memory cells of a high-integrity dynamic random access memory are generally very closely arranged, and therefore capacitor area almost cannot be increased in the horizontal direction, and the height of the capacitor needs to be increased in the perpendicular direction to increase capacitor area and capacitance value.

SUMMARY OF THE INVENTION

The invention provides a capacitor structure having a top supporting layer with a high-k material that can increase the mechanical strength of the capacitor structure and increase capacitor area and capacitance value at the same time.

The invention provides a capacitor structure including a substrate, a cup-shaped lower electrode, a top supporting layer, a capacitor dielectric layer, and an upper electrode. The cup-shaped lower electrode is located on the substrate. The top supporting layer surrounds the upper portion of the cup-shaped lower electrode. The top supporting layer includes a high-k material. Surfaces of the cup-shaped lower electrode and the top supporting layer are covered by the capacitor dielectric layer. A surface of the capacitor dielectric layer is covered by the upper electrode.

Based on the above, in the invention, the mechanical strength of the capacitor structure is increased by a reinforcing structure formed by the bottom supporting layer and the top supporting layer to prevent deformation to the capacitor structure or even tipping of the capacitor structure. Moreover, the top supporting layer of the invention has a high-k material and is able to be used as a portion of the capacitor dielectric layer. Therefore, in the invention, capacitor area and capacitance value can also be increased. Moreover, the invention also provides a method of manufacturing a capacitor structure in which a mold stripping step can be performed without a photomask. Therefore, the method of manufacturing a capacitor structure of the invention can be simplified, and manufacturing cost can be reduced.

In order to make the aforementioned features and advantages of the disclosure more comprehensible, embodiments accompanied with figures are described in detail below.

BRIEF DESCRIPTION OF THE DRAWINGS

The accompanying drawings are included to provide a further understanding of the invention, and are incorporated in and constitute a part of this specification. The drawings illustrate embodiments of the invention and, together with the description, serve to explain the principles of the invention.

FIG. 2A to FIG. 2G are respectively cross sections along line A-A of FIG. 1A to FIG. 1G.

FIG. 3A to FIG. 3G are respectively cross sections along line B-B of FIG. 1A to FIG. 1G.

DESCRIPTION OF THE EMBODIMENTS

Figure 1A:
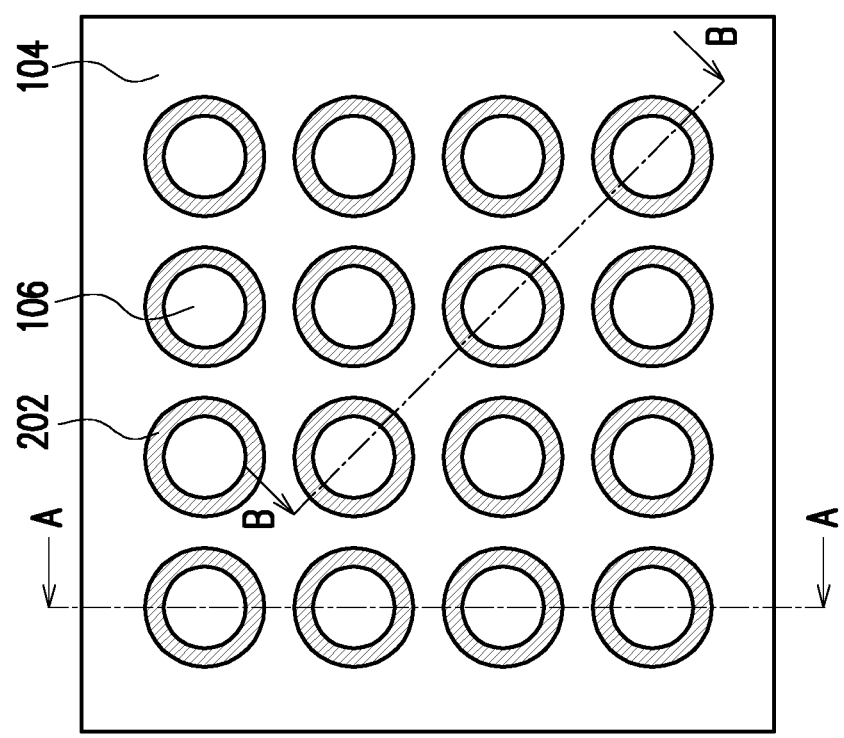
FIG. 1A to FIG. 1G are top views of a manufacturing process of a capacitor structure shown according to an embodiment of the invention.
Figure 1B:
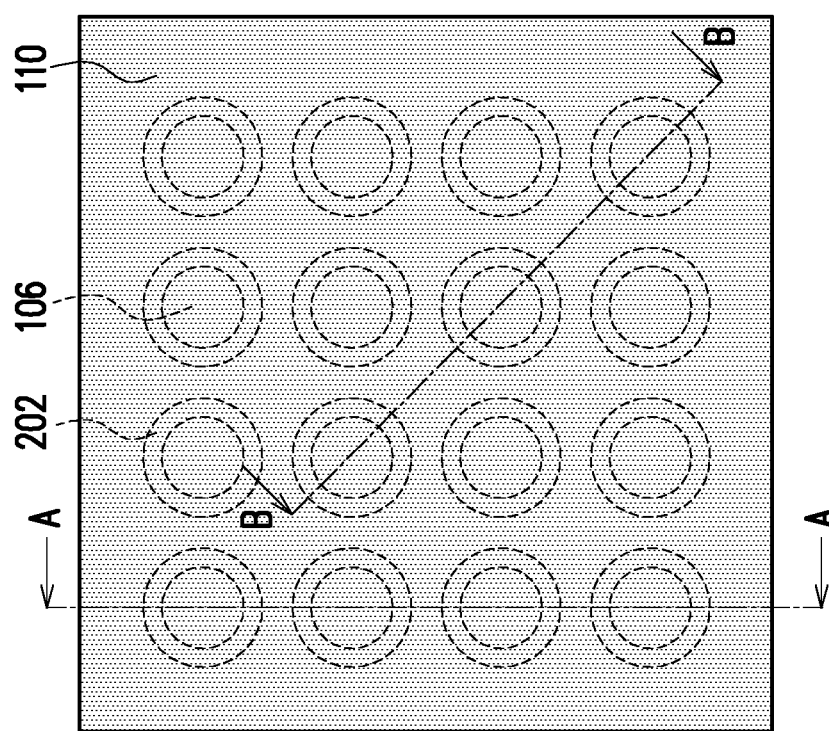

The invention is more comprehensively described with reference to the figures of the present embodiments. However, the invention may also be implemented in various different forms, and is not limited to the embodiments in the present specification. The thicknesses of the layers and regions in the figures are enlarged for clarity. The same or similar reference numerals represent the same or similar devices and are not repeated in the following paragraphs.

FIG. 1A to FIG. 1G are top views of a manufacturing process of a capacitor structure shown according to an embodiment of the invention. FIG. 2A to FIG. 2G are respectively cross sections along line A-A of FIG. 1A to FIG. 1G. FIG. 3A to FIG. 3G are respectively cross sections along line B-B of FIG. 1A to FIG. 1G.

Figure 3A:
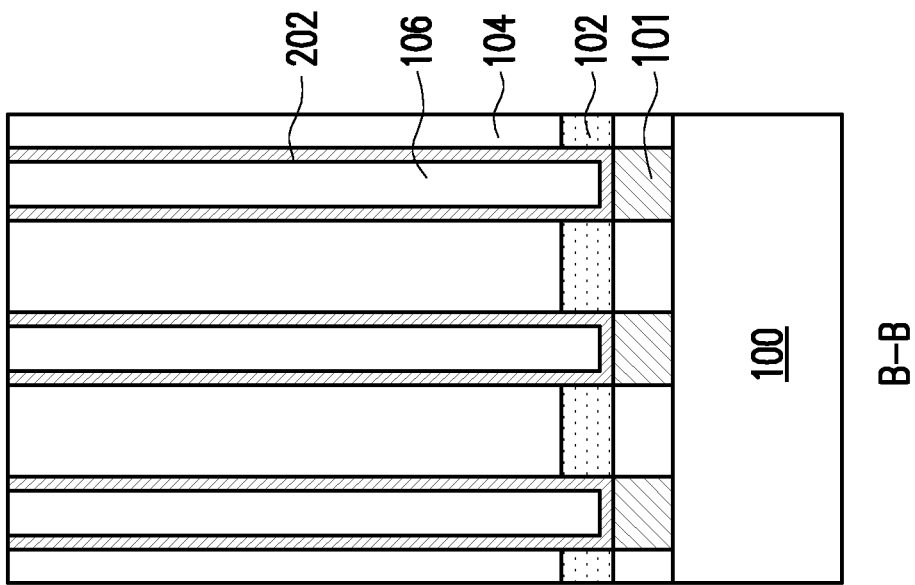
Figure 2A:
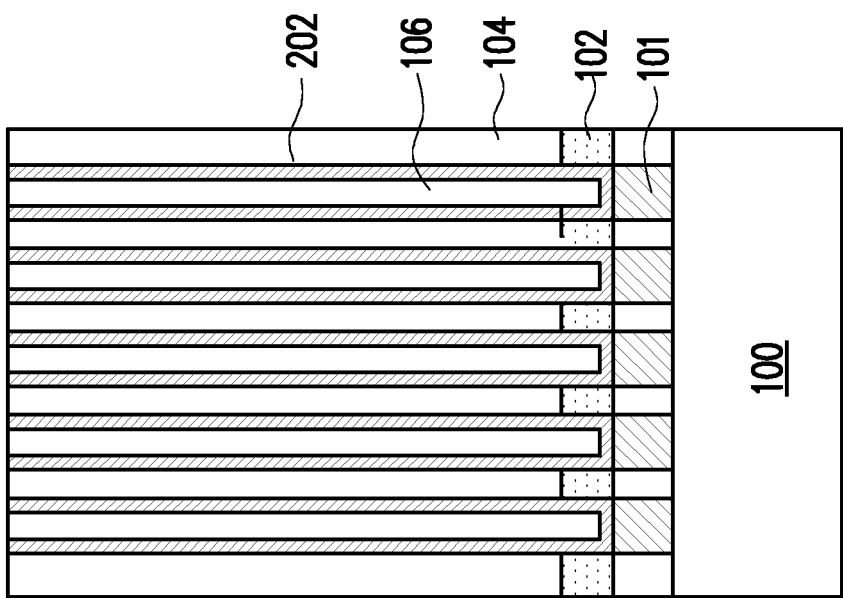
Figure 2B:
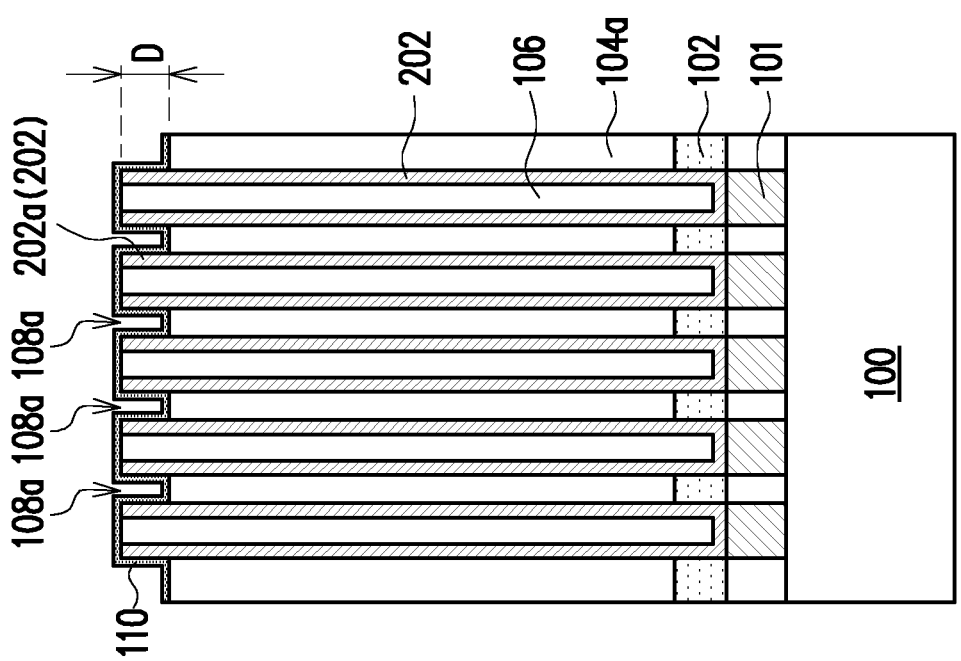

Referring to all of FIG. 1A, FIG. 2A, and FIG. 3A, the present embodiment provides a method of manufacturing a capacitor structure including the following steps. First, a substrate 100 is provided. The substrate 100 is, for instance, a semiconductor substrate, a semiconductor compound substrate, or a semiconductor-over-insulator (SOI). The semiconductor is, for instance, a Group IVA atom such as silicon or germanium. The semiconductor compound is, for instance, a semiconductor compound formed by a Group IVA atom, such as silicon carbide or silicon germanium, or a semiconductor compound formed by a Group IIIA atom and a Group VA atom, such as gallium arsenide.

Next, a bottom supporting layer 102 and a template layer 104 are formed on the substrate 100 in order. In an embodiment, the material of the bottom supporting layer 102 may be, for instance, silicon nitride (SiN), silicon oxynitride (SiON), silicon carbon oxynitride (SiCON), silicon carbide (SiC), or a combination thereof, and the forming method thereof may include chemical vapor deposition. The thickness of the bottom supporting layer 102 is, for instance, 40 nm to 100 nm. The material of the template layer 104 may be, for instance, silicon oxide or borophosphosilicate glass (BPSG), and the forming method thereof may include chemical vapor deposition. The thickness of the template layer 104 is, for instance, 1200 nm to 1500 nm.

Next, a plurality of cup-shaped lower electrodes 202 arranged in an array is formed in the bottom supporting layer 102 and the template layer 104. As shown in FIG. 2A and FIG. 3A, the cup-shaped lower electrodes 202 may be, for instance, U-shaped structures, and the inner surface thereof has an opening or a hollow space (not shown). A sacrificial layer 106 is filled in the opening or hollow space. Next, a planarization process is performed such that the top surface of the cup-shaped lower electrodes 202, the top surface of the sacrificial layer 106, and the top surface of the template layer 104 are substantially coplanar. In an embodiment, the planarization process may be an etch-back process or a chemical mechanical polishing (CMP) process. In an embodiment, the material of the cup-shaped lower electrodes 202 may be, for instance, titanium nitride (TiN), tantalum nitride (TaN), tungsten (W), titanium tungsten (TiW), aluminum (Al), copper (Cu), or metal silicide, and the cup-shaped lower electrodes 202 may be formed by chemical vapor deposition or physical vapor deposition. The material of the sacrificial layer 106 may be, for instance, aluminum oxide, and the sacrificial layer 106 may be formed by atomic layer deposition. Moreover, although the shape of the cup-shaped lower electrodes 202 shown in FIG. 1A is a circle when viewed from the top, the invention is not limited thereto. In other embodiments, the shape of the cup-shaped lower electrodes 202 viewed from the top may also be an ellipse or a polygon.

Moreover, in an embodiment, a plurality of capacitor contacts 101 is between the cup-shaped lower electrodes 202 and the substrate 100. The capacitor contacts 101 may be electrically connected to the cup-shaped lower electrodes 202 and the active regions (not shown) in the substrate 100. In an embodiment, the material of the capacitor contacts includes a conductive material such as polysilicon, metal material (such as W), metal silicide, or a combination thereof.

Referring to all of FIGS. 1A to 1B, FIGS. 2A to 2B, and FIGS. 3A to 3B, a portion of the template layer 104 is removed such that the top surface of a template layer 104a is lower than the top surface of the cup-shaped lower electrodes 202. In other words, the template layer 104 is recessed to form a plurality of recesses 108a and 108b. The recesses 108a and 108b are defined by the outer surface of an upper portion 202a of the cup-shaped lower electrodes 202 and the top surface of the template layer 104a. In an embodiment, a depth D of the recesses 108a and 108b may be between 80 nm and 120 nm. Then, a top supporting layer 110 is formed on the substrate 100. The top supporting layer 110 conformally covers the surface of the recesses 108a and 108b, the top surface of the sacrificial layer 106, and the top surface of the cup-shaped lower electrodes 202. In an embodiment, the material of the top supporting layer 110 includes a high-k material such as zirconium oxide (ZrO), lanthanum oxide (LaO), yttrium oxide (YO), gadolinium oxide (GdO), or a combination thereof. In another embodiment, the material of the top supporting layer 110 does not electrically connect adjacent cup-shaped lower electrodes 202, and therefore short circuit does not occur.

Figure 1C:
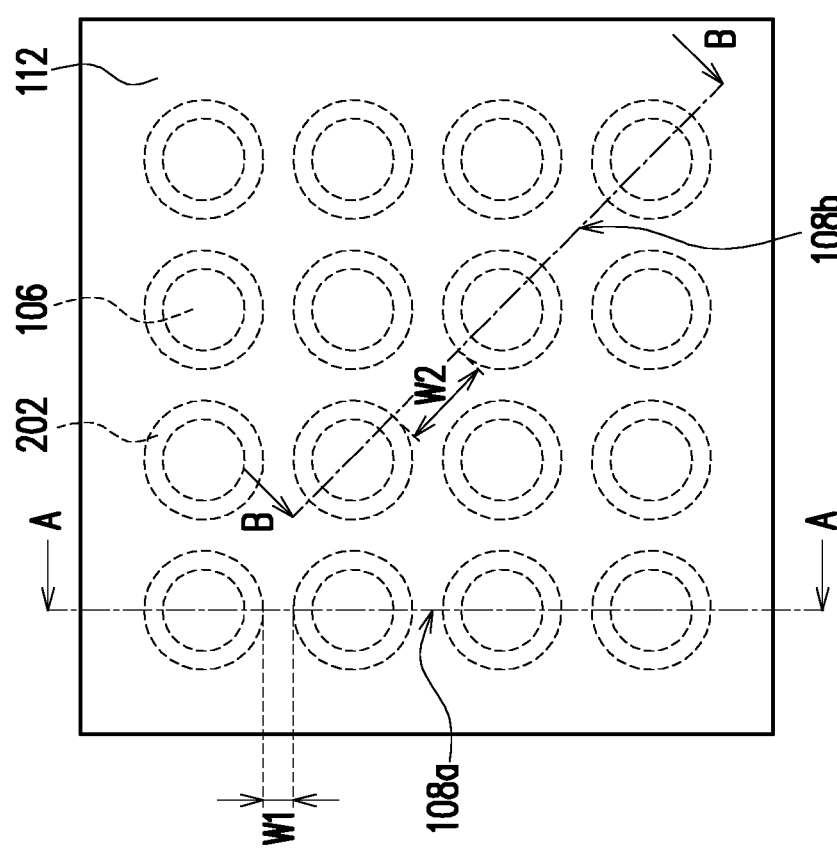
Figure 3B:
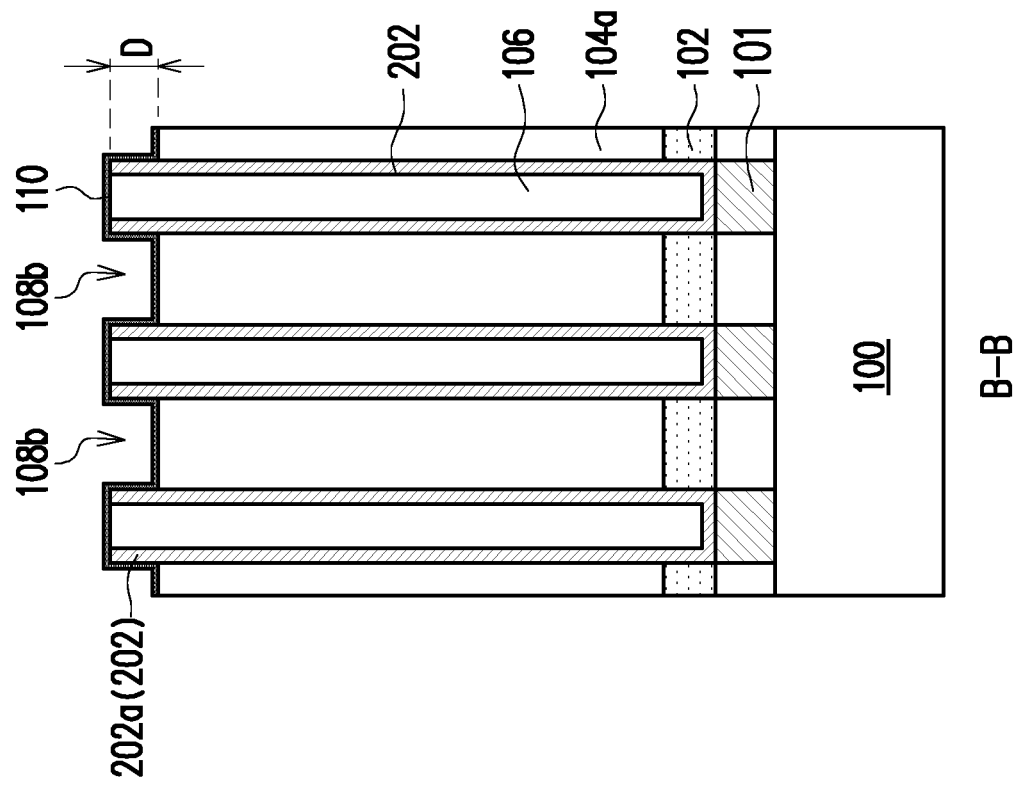
Figure 3C:
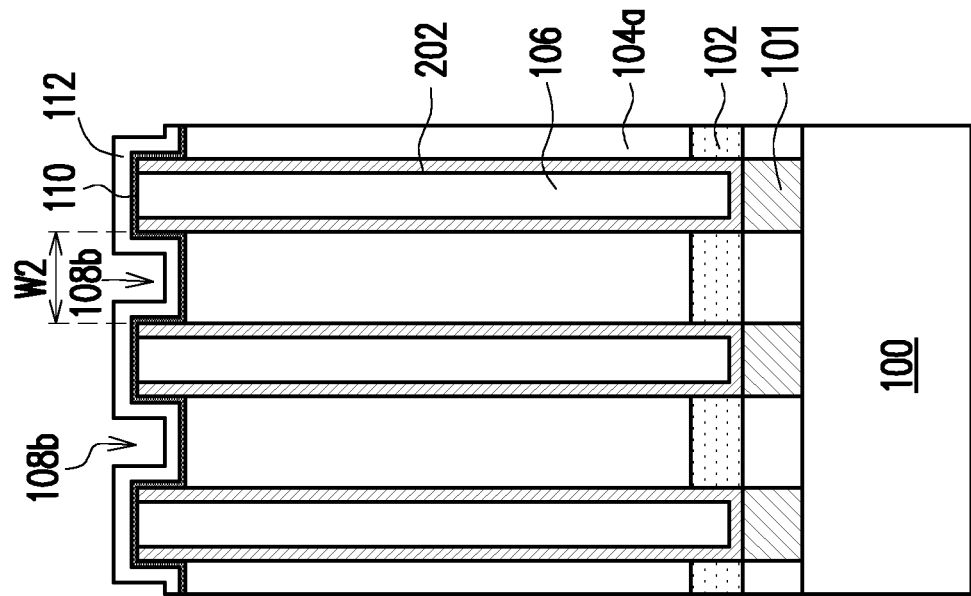
Figure 2C:
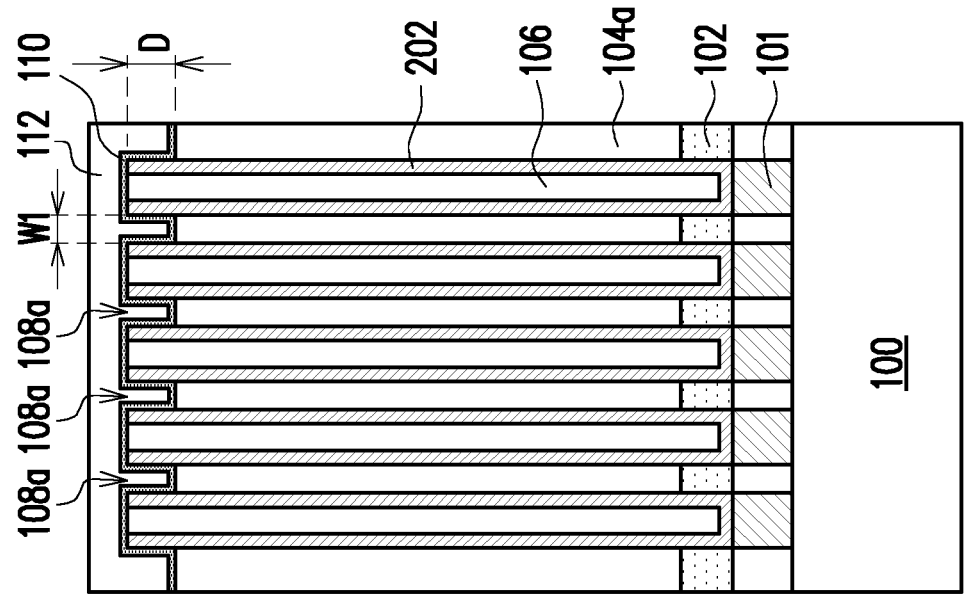

Referring to all of FIGS. 1B to 1C, FIGS. 2B to 2C, and FIGS. 3B to 3C, a sacrificial layer 112 is formed on the top supporting layer 110. As shown in FIG. 2C, a width W1 between the cup-shaped lower electrodes 202 in the direction of line A-A of FIG. 1C is smaller, and therefore the sacrificial layer 112 completely fills up the recess 108a. On the other hand, as shown in FIG. 3C, a width W2 between the cup-shaped lower electrodes 202 in the direction of line B-B of FIG. 1C is greater, and therefore the sacrificial layer 112 does not completely fill the recess 108b. The material of the sacrificial layer 112 may be, for instance, aluminum oxide, and the sacrificial layer 106 may be formed by atomic layer deposition. In an embodiment, the width W2 may be between 16 nm and 20 nm.

Figure 1D:
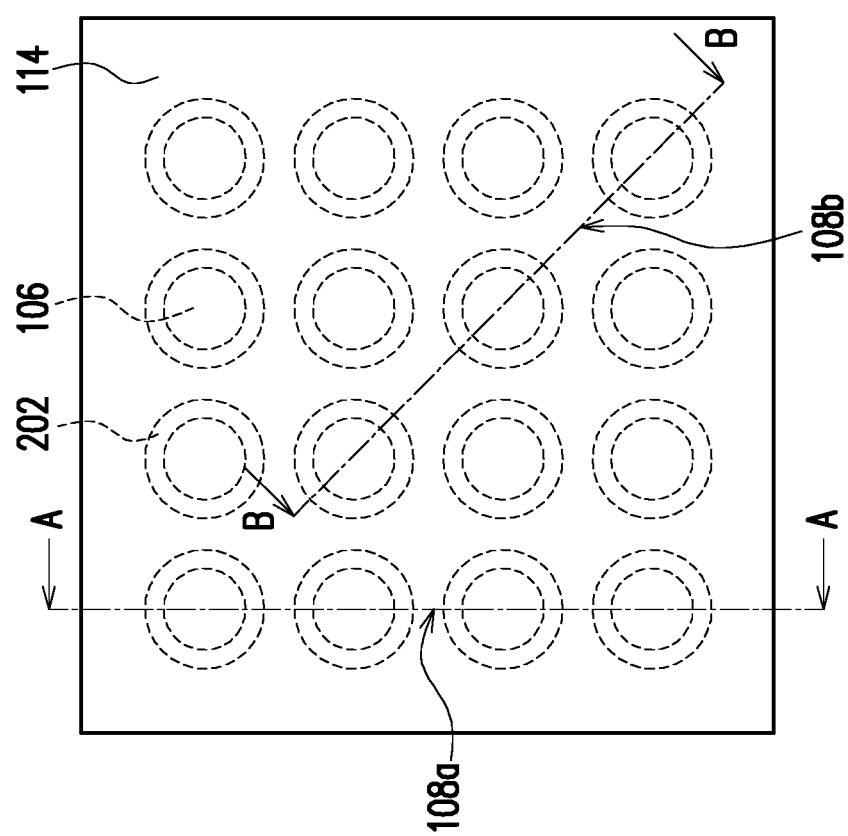
Figure 1E:
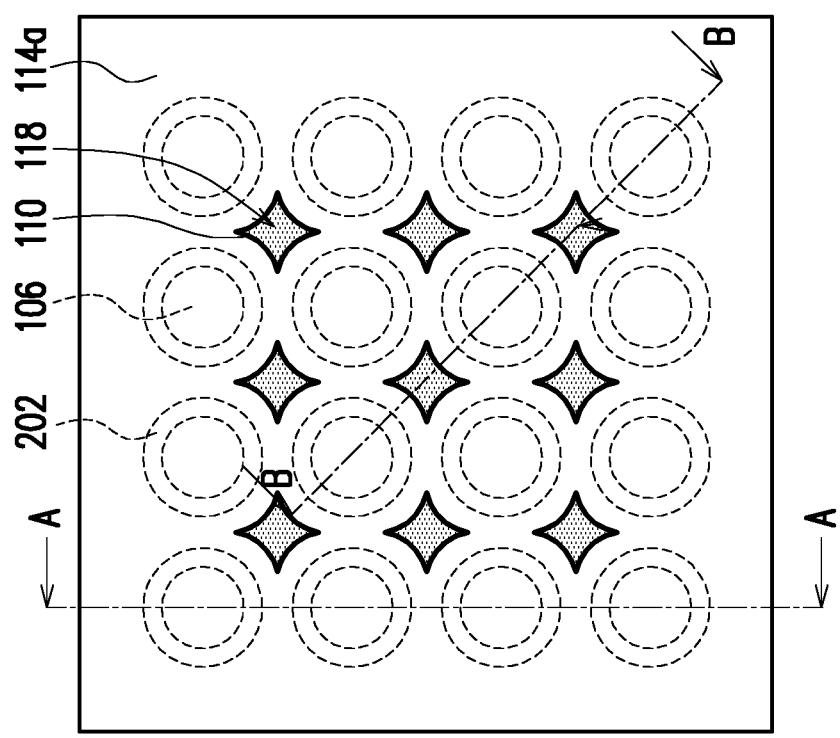
Figure 1F:
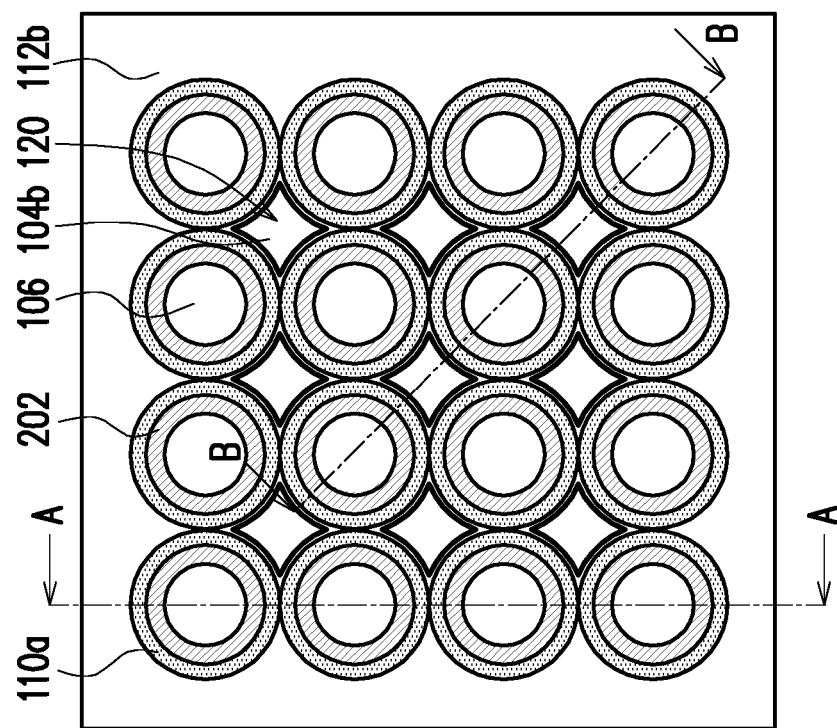
Figure 1G:
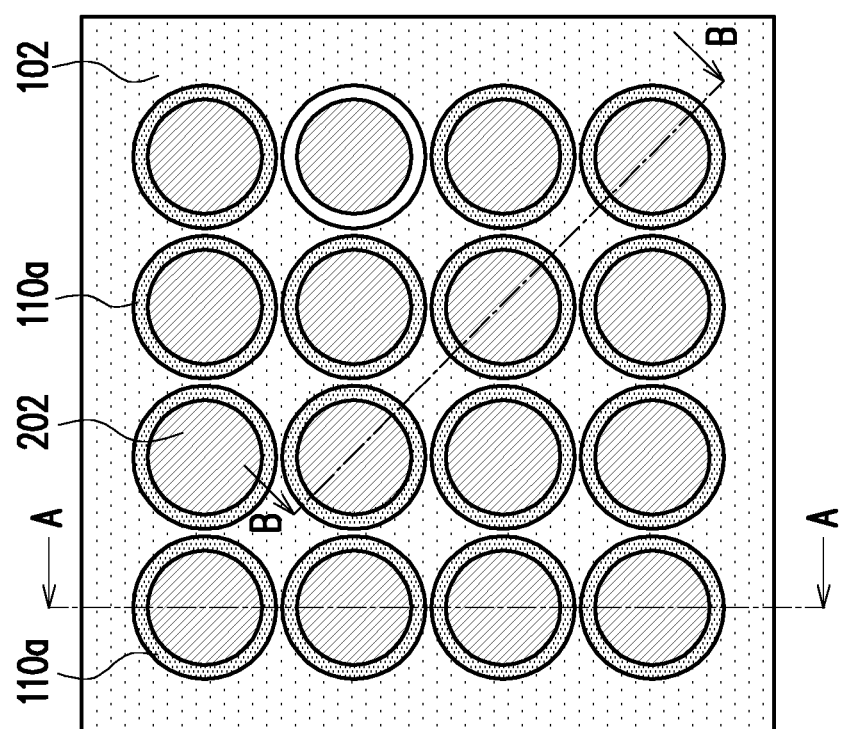
Figure 3D:
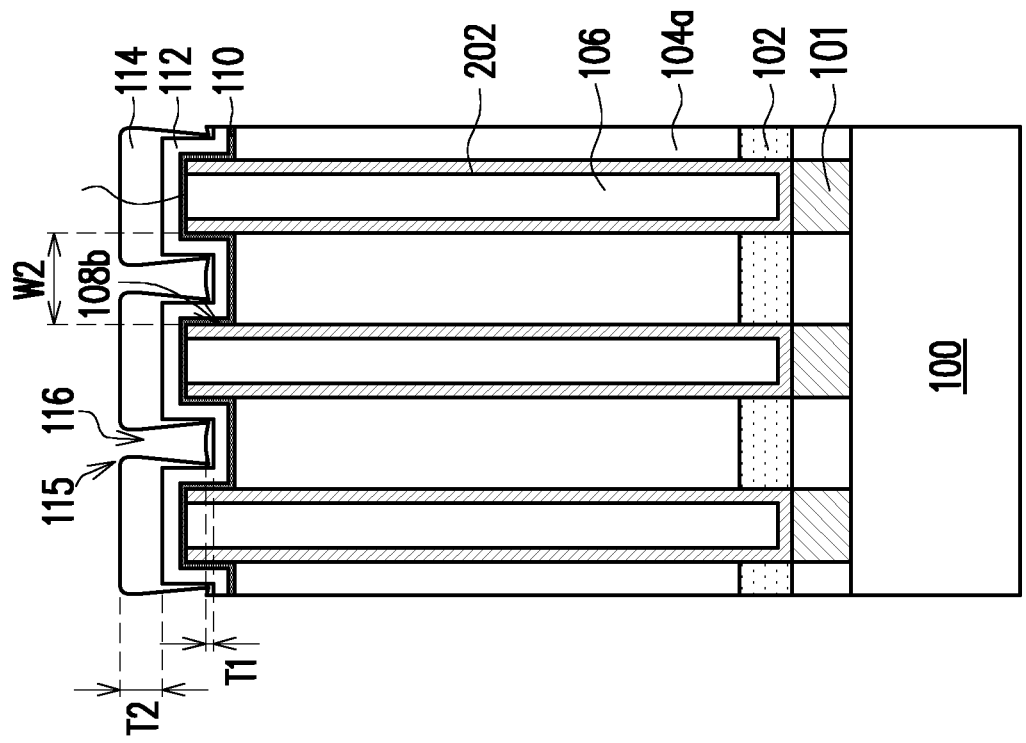
Figure 2D:
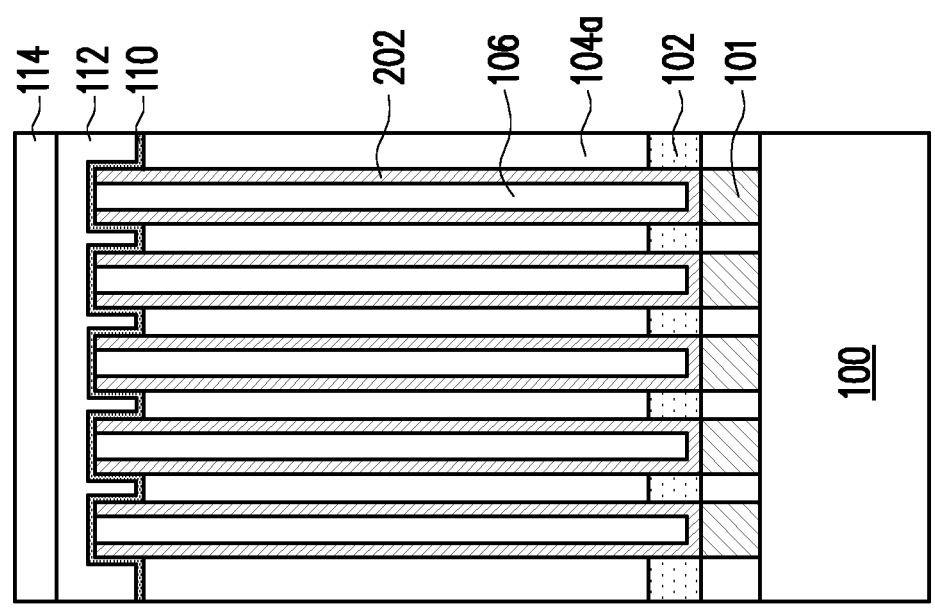

Referring to all of FIGS. 1C to 1D, FIGS. 2C to 2D, and FIGS. 3C to 3D, a dielectric layer 114 is formed on the sacrificial layer 112. As shown in FIG. 3D, since the width W2 between the cup-shaped lower electrodes 202 in the direction of line B-B of FIG. 1D is greater, the dielectric layer 114 does not completely fill the recess 108b. Specifically, a thickness T1 of the dielectric layer 114 located on the bottom surface of the recess 108b is much smaller than a thickness T2 of the dielectric layer 114 located on the top surface of the cup-shaped lower electrodes 202. As shown in FIG. 3D, the dielectric layer 114 adjacent to the sidewall of the recess 108b also has an overhang structure 115 such that a first opening 116 having a narrow top and a wide bottom is formed on the surface of the dielectric layer 114 located on the recess 108b. In an embodiment, the first opening 116 may be, for instance, a bottle opening. In an embodiment, the material of the dielectric layer 114 may be, for instance, silicon nitride or silicon oxynitride, and may be formed by chemical vapor deposition.

Figure 3E:
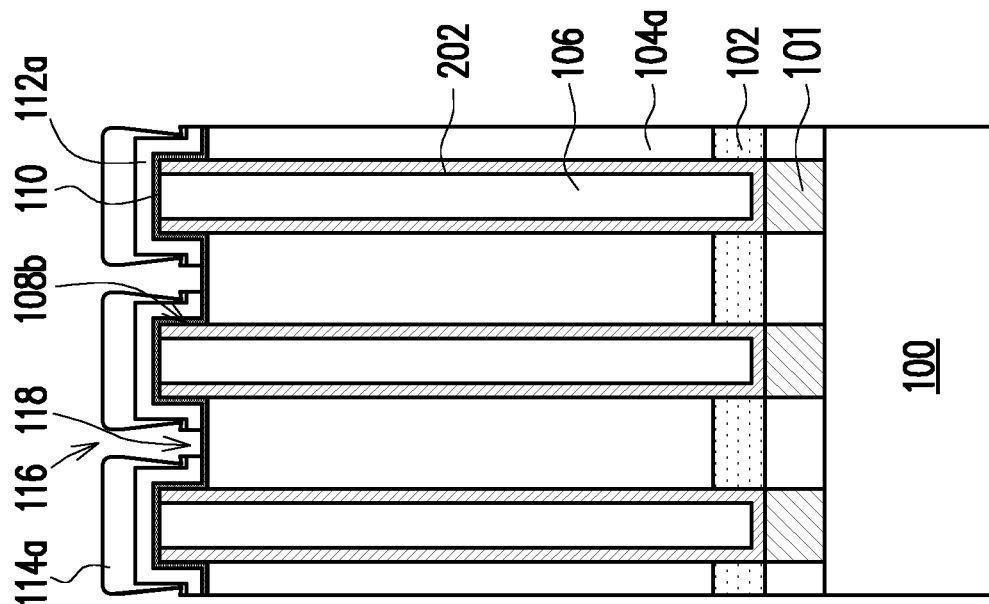
Figure 2E:
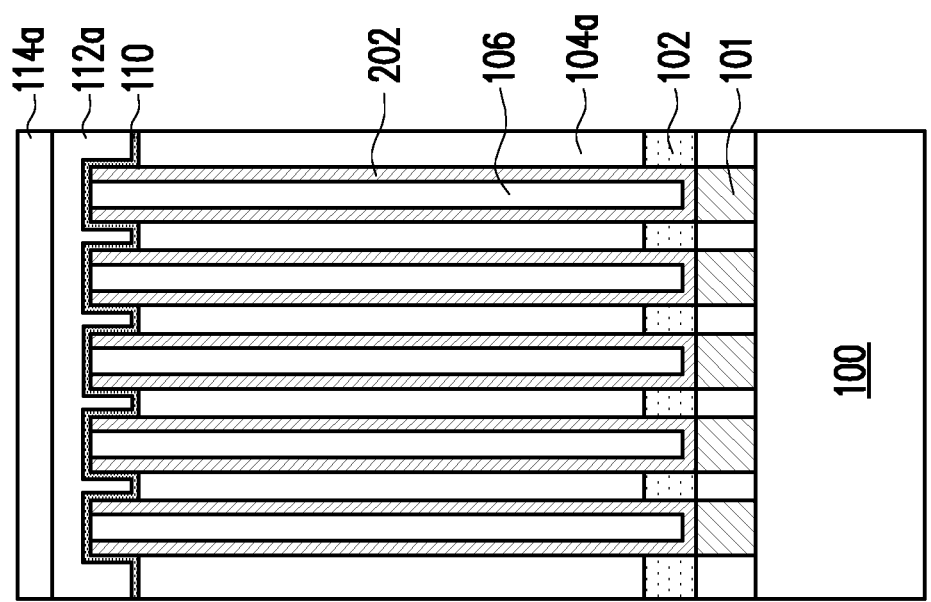
Figure 3F:
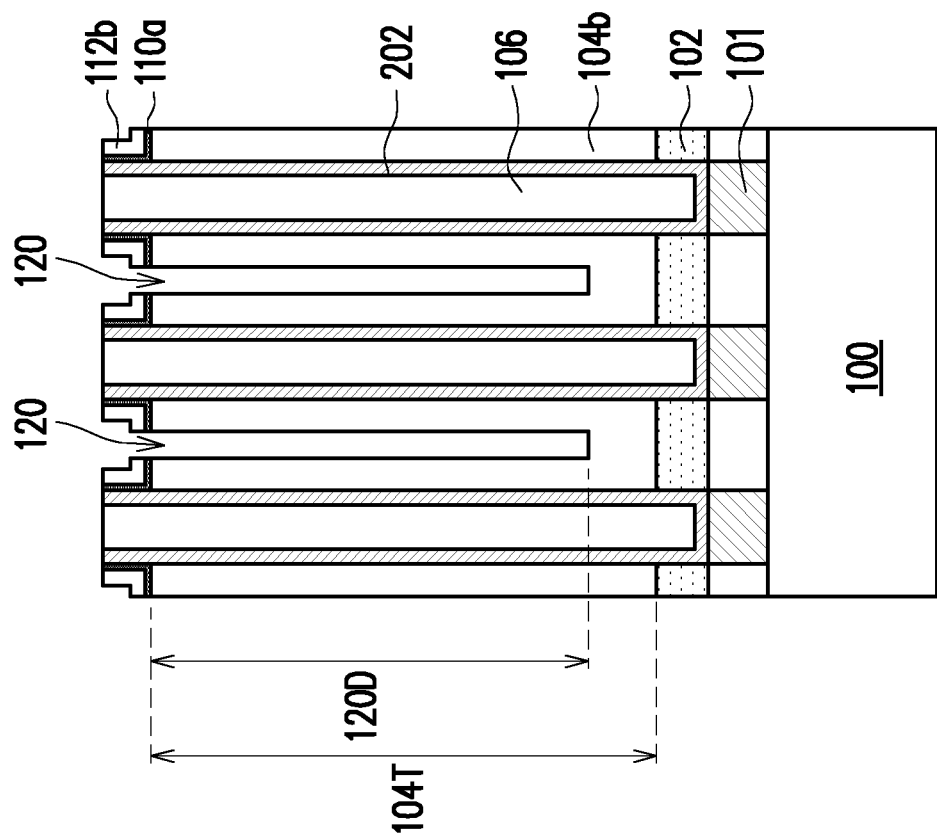
Figure 2F:
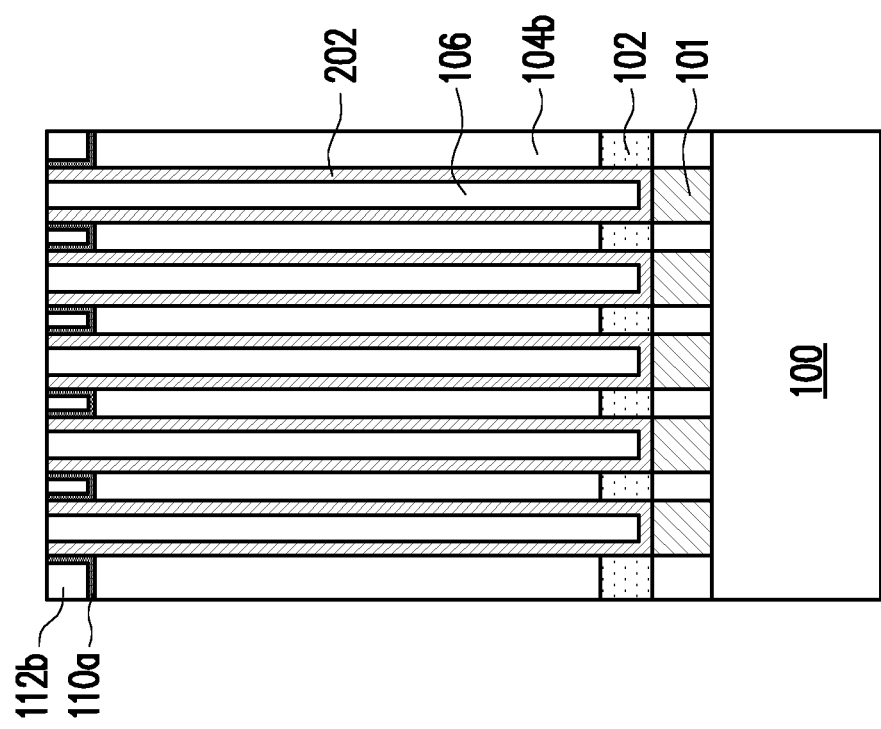

Referring to all of FIGS. 1D to 1E, FIGS. 2D to 2E, and FIGS. 3D to 3E, an etching process is performed to remove a portion of the dielectric layer 114 and a portion of the sacrificial layer 112 to form a second opening 118 below the first opening 116. The first opening 116 and the second opening 118 are connected, and the second opening 118 exposes a portion of the surface of the top supporting layer 110. As shown in FIGS. 3D and 3E, since the thickness T1 of the dielectric layer 114 located on the bottom surface of the recess 108b is much smaller than the thickness T2 of the dielectric layer 114 located on the top surface of the cup-shaped lower electrodes 202, when the dielectric layer 114 located on the bottom surface of the recess 108b is removed, a portion of the dielectric layer 114 located on the top surface of the cup-shaped lower electrodes 202 still remains. In other words, a portion of the surface of the top supporting layer 110 on the template layer 104a is exposed by a dielectric pattern 114a. In an embodiment, the etching process includes an anisotropic etching process, and may be, for instance, a reactive ion etching (RIE) process.

Referring to all of FIGS. 1E to 1F, FIGS. 2E to 2F, and FIGS. 3E to 3F, a portion of the top supporting layer 110 and a portion of the template layer 104a are removed by using the dielectric pattern 114a as a mask to form a third opening 120. Then, the remaining dielectric pattern 114a, sacrificial layer 112a, and a portion of the top supporting layer 110 are removed to form the structure of FIG. 2F and FIG. 3F. In an embodiment, the third opening 120 does not expose the surface of the bottom supporting layer 102. In another embodiment, a depth 120D of the third opening 120 may be greater than or equal to two-thirds of a thickness 104T of a template layer 104b. In an embodiment, since the forming of the third opening 120 does not require a lithography process or is photomask-free, the present embodiment may have the effect of simplified process and reduced manufacturing cost.

Referring to all of FIGS. 1F to 1G, FIGS. 2F to 2G, and FIGS. 3F to 3G, a mold stripping step is performed to remove the template layer 104b and the sacrificial layers 106 and 112b to expose the inner surface and outer surface of the cup-shaped lower electrodes 202. Specifically, the mold stripping step includes performing a wet etching process on the structure of FIG. 1F, i.e., an etchant is injected into the third opening 120. Therefore, the template layer 104b and the sacrificial layers 106 and 112 exposed in the etchant are completely removed. In an embodiment, the wet etching process may be performed using, for instance, an etchant such as buffer oxide etchant (BOE), hydrofluoric acid (HF), diluted hydrogen fluoride (DHF), or buffered hydrofluoric acid (BHF).

In this stage, as shown in FIG. 2G, a hollow structure is formed, and the entire structure is supported by the bottom supporting layer 102, the top supporting layer 110a, and the cup-shaped lower electrodes 202. Specifically, the top supporting layer 110a conformally covers and is connected to the upper sidewalls of two adjacent cup-shaped lower electrodes 202 to form a U-shaped structure. In an embodiment, the material of the template layer 104b (or the sacrificial layers 106 and 112b) is different from the material of the top supporting layer 110a (or the bottom supporting layer 102). For instance, the template layer 104b may be silicon oxide; the sacrificial layers 106 and 112 may be aluminum oxide; the top supporting layer 110a may be zirconium oxide; and the bottom supporting layer 102 may be silicon nitride. For the etchant, silicon oxide (or aluminum oxide) has a higher etch selectivity for zirconium oxide (or silicon nitride), and may be between 4 and 6. In other words, when the wet etching process is performed, the etch rate of silicon oxide (or aluminum oxide) is higher than the etch rate of zirconium oxide (or silicon nitride). Therefore, after the wet etching process, the top supporting layer 110a surrounds the upper portion 202a of the cup-shaped lower electrodes 202, the bottom supporting layer 102 surrounds a lower portion 202c of the cup-shaped lower electrodes 202, and a gap 122 may exist among a middle portion 202b of the top supporting layer 110a, the bottom supporting layer 102, and the cup-shaped lower electrodes 202 (as shown in FIG. 2G). The gap 122 may be filled with air.

It should be mentioned that, after the mold stripping step is performed, the inner surface and outer surface of the cup-shaped lower electrodes 202 are both exposed, and therefore the surface area of the capacitor may be effectively increased, such that capacitance is increased. In an embodiment, the top surface of the top supporting layer 110 and the top surface of the cup-shaped lower electrodes 202 are coplanar. In another embodiment, the heights of the two sidewalls of each of the cup-shaped lower electrodes 202 are the same.

Figure 4:
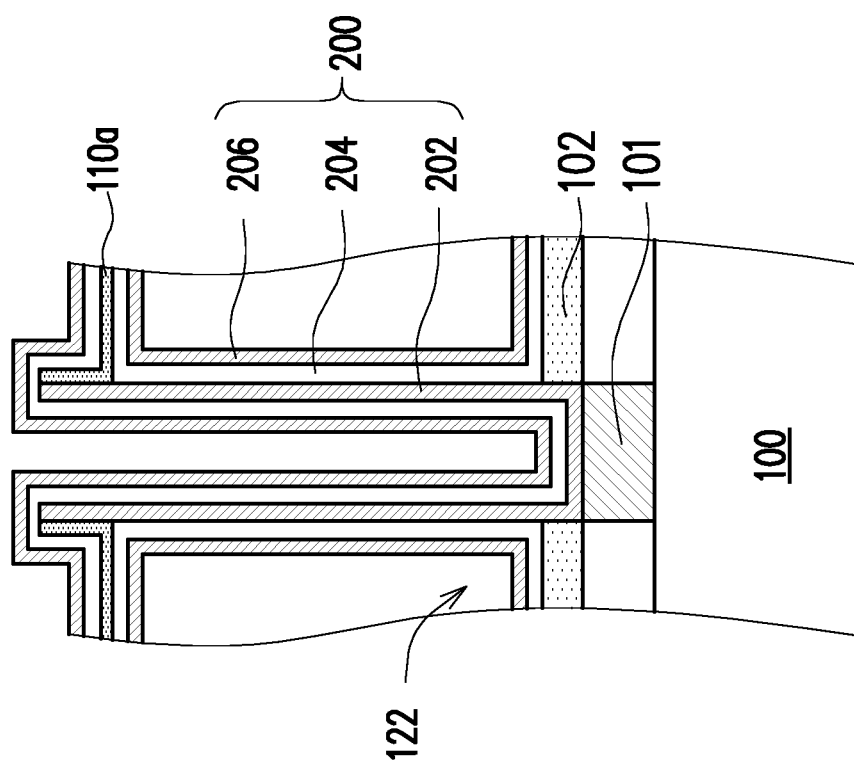
FIG. 4 is an enlarged view of a portion of the capacitor structure of FIG. 2G.

FIG. 4 is an enlarged view of a portion of the capacitor structure 124 of FIG. 2G.

Referring to FIG. 4, after the mold stripping step is performed, a capacitor dielectric layer 204 is formed on the inner surface and the outer surface of the cup-shaped lower electrodes 202 and the surface of the top supporting layer 110a. Then, an upper electrode 206 is formed on the surface of the capacitor dielectric layer 204. The cup-shaped lower electrodes 202, the capacitor dielectric layer 204, and the upper electrode 206 may form a capacitor 200. It should be mentioned that, the top supporting layer 110a is formed by a high-k material. Therefore, the top supporting layer 110a may be regarded as a portion of the capacitor dielectric layer 204. In other words, the top supporting layer 110a of the present embodiment not only may increase the mechanical strength of the capacitor 200, but may also increase capacitor area and capacitance value.

In an embodiment, the capacitor dielectric layer 204 includes a high-k material layer, and the material thereof may be, for instance, hafnium oxide (HfO), zirconium oxide (ZrO), aluminum oxide (AlO), aluminum nitride (AlN), titanium oxide (TiO), lanthanum oxide (LaO), yttrium oxide (YO), gadolinium oxide (GdO), tantalum oxide (TaO), or a combination thereof. The material of the upper electrode 206 may be, for instance, titanium nitride (TiN), tantalum nitride (TaN), tungsten (W), titanium tungsten (TiW), aluminum (Al), copper (Cu), or metal silicide. The method of forming the capacitor dielectric layer 204 and the upper electrode 206 may include a chemical vapor deposition or atomic layer deposition (ALD) process.

Based on the above, in the invention, the mechanical strength of the capacitor structure is increased by a reinforcing structure formed by the bottom supporting layer and the top supporting layer to prevent deformation to the capacitor structure or even tipping of the capacitor structure. Moreover, the top supporting layer of the invention has a high-k material and is able to be used as a portion of the capacitor dielectric layer. Therefore, in the invention, capacitor area and capacitance value can also be increased. Moreover, the invention also provides a method of manufacturing a capacitor structure in which a mold stripping step can be performed without a photomask. Therefore, the method of manufacturing a capacitor structure of the invention can be simplified, and manufacturing cost can be reduced.

Although the invention has been described with reference to the above embodiments, it will be apparent to one of ordinary skill in the art that modifications to the described embodiments may be made without departing from the spirit of the invention. Accordingly, the scope of the invention is defined by the attached claims not by the above detailed descriptions.

What is claimed is:

1. A capacitor structure, comprising:
   a plurality of cup-shaped lower electrodes located on a substrate;
   a top supporting layer completely surrounding an upper portion of outer sidewalls of each cup-shaped lower electrode, wherein the top supporting layer comprises a high-k material, the top supporting layer that conformally covers the upper portions of the outer sidewalls of two adjacent cup-shaped lower electrodes is a U-shaped structure, and the top supporting layer has a concave top surface lower than a topmost surface of each cup-shaped lower electrode;
   a capacitor dielectric layer covering surfaces of the plurality of cup-shaped lower electrodes and a surface of the top supporting layer; and
   an upper electrode covering a surface of the capacitor dielectric layer.

2. The capacitor structure of claim 1, wherein the top supporting layer is a portion of the capacitor dielectric layer.

3. The capacitor structure of claim 1, further comprising a bottom supporting layer surrounding a lower portion of the outer sidewalls of each cup-shaped lower electrode, wherein a gap exists between the bottom supporting layer and the top supporting layer, and the gap is filled with air.

4. The capacitor structure of claim 1, wherein the top supporting layer comprises zirconium oxide (ZrO), lanthanum oxide (LaO), yttrium oxide (YO), gadolinium oxide (GdO), or a combination thereof.

5. The capacitor structure of claim 1, wherein a topmost surface of the top supporting layer and the topmost surface of each cup-shaped lower electrode are coplanar.

6. The capacitor structure of claim 1, wherein heights of two sidewalls of each cup-shaped lower electrode are the same.

* * * * *